(12) United States Patent
Zhou

(10) Patent No.: US 10,566,401 B2
(45) Date of Patent: Feb. 18, 2020

(54) THIN FILM TRANSISTOR ARRAY SUBSTRATE AND PREPARING METHOD THEREFOR, AND OLED DISPLAY DEVICE

(71) Applicant: Shenzhen China Star Optoelectronics Semiconductor Display Technology Co., Ltd., Shenzhen, Guangdong (CN)

(72) Inventor: Xingyu Zhou, Guangdong (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 25 days.

(21) Appl. No.: 15/740,606

(22) PCT Filed: Jul. 13, 2017

(86) PCT No.: PCT/CN2017/092723
§ 371 (c)(1),
(2) Date: Dec. 28, 2017

(87) PCT Pub. No.: WO2019/000493
PCT Pub. Date: Jan. 3, 2019

(65) Prior Publication Data
US 2019/0006448 A1   Jan. 3, 2019

(30) Foreign Application Priority Data
Jun. 28, 2017   (CN) .......................... 2017 1 0509893

(51) Int. Cl.
*H01L 27/32* (2006.01)
*H01L 27/12* (2006.01)
(Continued)

(52) U.S. Cl.
CPC ....... *H01L 27/3262* (2013.01); *G09G 3/3233* (2013.01); *H01L 27/1225* (2013.01);
(Continued)

(58) Field of Classification Search
CPC .................. H01L 29/16; H01L 29/167; H01L 29/24–245; H01L 29/66757;
(Continued)

(56) References Cited

U.S. PATENT DOCUMENTS 9,634,038 B2 * 4/2017 Kwon ................. H01L 27/1248
2006/0151790 A1   7/2006 Kang et al.
(Continued)

FOREIGN PATENT DOCUMENTS

| CN | 101232041 A | 7/2008 |
|---|---|---|
| CN | 104538401 A | 4/2015 |

(Continued)

*Primary Examiner* — Thao X Le
*Assistant Examiner* — Gardner W. S. Swan
(74) *Attorney, Agent, or Firm* — Mintz Levin Cohn Ferris Glovsky and Popeo, P.C.; Steven M. Jensen

(57) ABSTRACT

The present disclosure discloses a thin film transistor array substrate including an active layer disposed on a base substrate, wherein the active layer includes a first active region and a second active region located in a same structural layer, the first active region has a material comprising poly-silicon, and includes a first channel region, and a first source region and a first drain region that are located at both sides of the first channel region, respectively, the first source region having a first contact layer disposed thereon, the first drain region having a second contact layer disposed thereon, and materials of both the first and second contact layers being boron-doped poly-silicon; and the second active region has a material comprising metal oxide semiconductor, and includes a second channel region and a second source region and a second drain region that are located at both sides of the second channel region, respectively. The present disclosure also discloses a preparing method for the thin film transistor array substrate as mentioned above, and an OLED display device including the array substrate.

5 Claims, 7 Drawing Sheets

(51) Int. Cl.
*G09G 3/3233* (2016.01)
*H01L 29/49* (2006.01)
*H01L 29/417* (2006.01)

(52) U.S. Cl.
CPC ...... *H01L 27/1229* (2013.01); *H01L 27/1255* (2013.01); *H01L 27/3265* (2013.01); *H01L 29/41775* (2013.01); *H01L 29/4908* (2013.01); *H01L 27/3248* (2013.01)

(58) Field of Classification Search
CPC ......... H01L 29/66765; H01L 21/02529; H01L 21/02565; H01L 27/32–3279
See application file for complete search history.

(56) References Cited

U.S. PATENT DOCUMENTS

2009/0250694 A1* 10/2009 Tanaka ................ H01L 27/1225 257/43
2009/0278131 A1* 11/2009 Kwon ................ H01L 27/1255 257/72
2013/0023114 A1* 1/2013 Power ................ H01L 27/11521 438/585
2015/0055051 A1* 2/2015 Osawa ................ H01L 27/1225 349/48
2017/0133475 A1* 5/2017 Min ........................ H01L 29/45
2017/0262121 A1* 9/2017 Kurasawa ........... G02F 1/13338
2017/0352711 A1* 12/2017 Zhang ................ H01L 27/3262
2018/0190823 A1* 7/2018 Ohara ............... H01L 21/32105

FOREIGN PATENT DOCUMENTS

| CN | 105280679 A | 1/2016 |
|----|-------------|--------|
| CN | 105489618 A | 4/2016 |
| CN | 105514116 A | 4/2016 |
| CN | 106057735 A | 10/2016 |
| CN | 106409844 A | 2/2017 |

* cited by examiner

THIN FILM TRANSISTOR ARRAY SUBSTRATE AND PREPARING METHOD THEREFOR, AND OLED DISPLAY DEVICE

CROSS-REFERENCES TO RELATED APPLICATIONS

This application is a U.S. national phase application, pursuant to 35 U.S.C. § 371, of PCT/CN2017/092723, filed Jul. 13, 2017, designating the United States, which claims priority to Chinese Application No. 201710509893.6 filed Jun. 28, 2017. The entire contents of the aforementioned patent applications are incorporated herein by this reference.

TECHNICAL FILED

The present disclosure relates to a display technical field, more particularly, to a thin film transistor array substrate and a preparing method therefor, and also relates to an OLED display device including the thin film transistor array substrate.

BACKGROUND ART

A flat panel display device has been widely applied for its many advantages such as a thin body, power saving, and radiation-free. Current flat panel display devices mainly include a Liquid Crystal Display (LCD), and an Organic Light Emitting Display (OLED). A Thin Film Transistor (TFT) is an important component of the flat panel display device, and may be formed on a glass substrate or a plastic substrate and is usually applied in for example LCD and OLED as a switching device and a driving device.

At present, the OLED display device is a mainly current-controlled light emitting device, and the luminance uniformity is controlled by a corresponding current. Usually, a thin film transistor array substrate of the OLED display device, corresponding to each sub-pixel, mainly includes a driving transistor that drives a light emitting diode, a switching transistor that transmits data voltage to a gate node of the driving transistor, and a storage capacitor that enables a certain level of voltage to maintain one frame time.

In the existing thin film transistor array substrate of the OLED display device, all thin film transistors, that is, the driving transistors and the switching transistors, adopt the same material of an active layer. Normally, poly-silicon or a metal oxide semiconductor material is adopted as the material of the active layer of the thin film transistor. The active layer of the thin film transistor which uses a poly-silicon material has high mobility, but with a large leakage current and worse uniformity; while the active layer of the thin film transistor which uses the metal oxide semiconductor material has better uniformity, but with comparatively low mobility. Therefore, in the thin film transistor array substrate of the OLED display device, for the driving transistor and the switching transistor that implement different functions, if they both use a single semiconductor material as the active layer, the disadvantage (bad uniformity or low mobility) of the semiconductor material will be enlarged, which is not conducive to improvement of the display quality of the OLED display device.

SUMMARY

In view of this, the present disclosure provides a thin film transistor array substrate which is mainly applied in an OLED display device. For a driving transistor and a switching transistor that implement different functions in the thin film transistor array substrate, different semiconductor materials are adopted as an active layer to optimize electric performances of the driving transistor and the switching transistor, so as to improve display quality of the OLED display device.

In order to achieve the above purposes, the present disclosure adopts the following technical solutions:

a thin film transistor array substrate, including an active layer disposed on a base substrate, wherein the active layer includes a first active region and a second active region located in a same structural layer, the first active region has a material comprising poly-silicon, and includes a first channel region, and a first source region and a first drain region that are located at both sides of the first channel region, respectively, the first source region having a first contact layer disposed thereon, the first drain region having a second contact layer disposed thereon, and materials of both the first and second contact layers being boron-doped poly-silicon; and wherein the second active region has a material comprising metal oxide semiconductor, and includes a second channel region and a second source region and a second drain region that are located at both sides of the second channel region, respectively.

Wherein the thin film transistor array substrate specifically includes: the base substrate; the active layer patterned to be formed on the base substrate; a gate insulating layer covering the active layer; a first metal layer patterned to be formed on the gate insulating layer, wherein the first metal layer includes a first gate electrode, a second gate electrode and a scan line, the first gate electrode is relatively located right above the first channel region, and the second gate electrode is relatively located right above the second channel region; an interlayer dielectric layer covering the first gate electrode, the second gate electrode and the scan line; a second metal layer patterned to be formed on the interlayer dielectric layer, wherein the second metal layer includes a first source electrode, a first drain electrode, a second source electrode, a second drain electrode, and a data line, the first source electrode is connected to the first contact layer through a first via hole disposed in the interlayer dielectric layer and the gate insulating layer, the first drain electrode is connected to the second contact layer through a second via hole disposed in the interlayer dielectric layer and the gate insulating layer, the second source electrode is connected to the second source region through a third via hole disposed in the interlayer dielectric layer and the gate insulating layer, and the second drain electrode is connected to the second drain region through a fourth via hole disposed in the interlayer dielectric layer and the gate insulating layer; a planarizing layer covering the first source electrode, the first drain electrode, the second source electrode, the second drain electrode and the data line; and a transparent conductive layer patterned to be formed on the planarizing layer, wherein the transparent conductive layer includes a pixel electrode which is connected to the second source electrode or the second drain electrode through a fifth via hole disposed in the planarizing layer.

The active layer also includes a storage capacitor region including a poly-silicon layer and a boron-doped poly-silicon layer sequentially disposed on the base substrate.

The first contact layer and the second contact layer have a thickness of 20-200 nm, respectively.

The present disclosure also provides a preparing method for the thin film transistor array substrate as mentioned above, the method includes preparing a patterned active layer including a first active region and a second active region on a base substrate, the preparing of the patterned active layer including:

sequentially forming an amorphous silicon thin film layer and a boron-doped amorphous silicon thin film layer on the base substrate;

performing crystallizing processing on the amorphous silicon thin film layer and the boron-doped amorphous silicon thin film layer using a thermal annealing process, and correspondingly forming a poly-silicon thin film layer and a boron-doped poly-silicon thin film layer;

etching the poly-silicon thin film layer and the boron-doped poly-silicon thin film layer by using a first photoetching process to form a patterned first active region, wherein the first active region includes a first channel region and a first source region and a first drain region that are located at both sides of the first channel region, respectively;

forming a metal oxide semiconductor thin film layer on the base substrate located outside the first active region;

etching the metal oxide semiconductor thin film layer by using a second photoetching process to form a patterned second active region, wherein the second active region includes a second channel region and a second source region and a second drain region that are located at both sides of the second channel region, respectively;

removing a boron-doped poly-silicon thin film layer located over the first channel region by using a third photoetching process, so that the boron-doped poly-silicon thin film layer over the first source region remains to form a first contact layer, and the boron-doped poly-silicon thin film layer over the first drain region remains to form a second contact layer; and converting the semiconductor materials of the second source region and the second drain region into conductor materials by applying an ion injection process.

Wherein the preparing method specifically includes steps of:

S1: forming the patterned active layer on the base substrate;

S2: forming a gate insulating layer on the active layer;

S3: forming a patterned first metal layer on the gate insulating layer by using a fourth photoetching process, wherein the first metal layer includes a first gate electrode, a second gate electrode and a scan line, the first gate electrode is relatively located right above the first channel region, and the second gate electrode is relatively located right above the second channel region;

S4: forming an interlayer dielectric layer on the first gate electrode, the second gate electrode and the scan line;

S5: etching in the interlayer dielectric layer and the gate insulating layer to form a first via hole that exposes the first contact layer, a second via hole that exposes the second contact layer, a third via hole that exposes the second source region, and a fourth via hole that exposes the second drain region by using a fifth photoetching process;

S6: forming a patterned second metal layer on the interlayer dielectric layer by using a sixth photoetching process, wherein the second metal layer includes a first source electrode, a first drain electrode, a second source electrode, a second drain electrode, and a data line, the first source electrode is connected to the first contact layer through the first via hole, the first drain electrode is connected to the second contact layer through the second via hole, the second source electrode is connected to the second source region through the third via hole, and the second drain electrode is connected to the second drain region through the fourth via hole;

S7: forming a planarizing layer on the first source electrode, the first drain electrode, the second source electrode, the second drain electrode and the data line;

S8: etching in the planarizing layer to form a fifth via hole that exposes the second source electrode or the second drain electrode by applying a seventh photoetching process; and S9: forming a patterned transparent conductive layer on the planarizing layer by using an eighth photoetching process, wherein the transparent conductive layer includes a pixel electrode which is connected to the second source electrode or the second drain electrode through the fifth via hole.

The boron-doped amorphous silicon thin film layer has a thickness of 20-200 nm, the thermal annealing process is performed at a temperature of 500-1000° C. with a time of 5-60 minutes.

The active layer also includes a storage capacitor region, when the first photoetching process is performed, a patterned storage capacitor region is formed by etching the poly-silicon thin film layer and the boron-doped poly-silicon thin film layer, and the storage capacitor region includes a stack of a poly-silicon layer and a boron-doped poly-silicon layer.

In the third photoetching process, the boron-doped poly-silicon thin film layer over the first channel region is removed by applying a plasma etching, while the plasma is also used to be injected into the second source region and the second drain region to convert the semiconductor materials of the second source region and the second drain region into conductor materials.

Another aspect of the present disclosure provides an OLED display device which includes the thin film transistor array substrate as mentioned above.

The thin film transistor array substrate provided in the embodiment of the present disclosure selects to use different semiconductor materials as the active layer for a driving transistor and a switching transistor that implement different functions in the thin film transistor array substrate. For the driving transistor that drives the light emitting diode, a metal oxide semiconductor material is adopted as the active layer to utilize its advantage of better uniformity; while for the switching transistor that transmits data voltage to a gate node of the driving transistor, poly-silicon is adopted as the active layer to utilize its advantage of high mobility. Thus, electric performances of the driving transistor and the switching transistor are optimized, respectively, which improves the display quality of the OLED display device.

DETAILED DESCRIPTION OF EXEMPLARY EMBODIMENTS

In order for the purpose, technical solution and advantages of the present disclosure to be clearer, specific implementations of the present disclosure will be explained below in details in conjunction with the figures. Examples of these preferred implementations are illustrated in the figures. The implementations of the present disclosure illustrated in the figures and described according to the figures are only exemplary, and the present disclosure is not limited to these implementations.

Here, it also needs to be explained that in order to prevent the present disclosure from being made unclear due to unnecessary details, the figures only illustrate structures and/or processing steps closely related to the solutions according to the present disclosure, and omit other details slightly related to the present disclosure.

Figure 1:
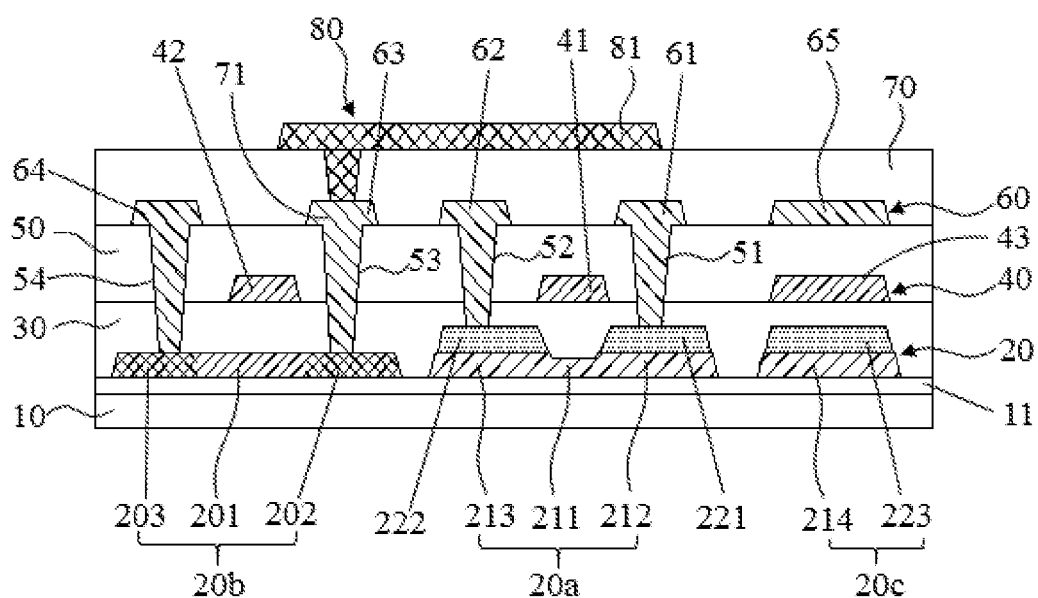
FIG. 1 is a structure diagram of a thin film transistor array substrate provided in an embodiment of the present disclosure.

The present embodiment first provides a thin film transistor array substrate, as illustrated in FIG. 1, the thin film transistor array substrate includes an active layer 20, a gate insulating layer 30, a first metal layer 40, an interlayer dielectric layer 50, a second metal layer 60, a planarizing layer 70 and a transparent conductive layer 80 that are disposed on a base substrate 10 sequentially.

In a preferred solution, a buffer layer 11 is also disposed between the active layer 20 and the base substrate 10. The active layer 20 includes a first active region 20a and a second active region 20b located in the same structural layer, a material of the first active region 20a is poly-silicon, the first active region 20a includes a first channel region 211 and a first source region 212 and a first drain region 213 that are located at both sides of the first channel region 211, respectively. The first source region 212 is disposed with a first contact layer 221, the first drain region 213 is disposed with a second contact layer 222, and materials of the first and second contact layers 221 and 222 are both boron-doped poly-silicon. A material of the second active region 20b is a metal oxide semiconductor material, the second active region 20b includes a second channel region 201 and a second source region 202 and a second drain region 203 that are located at both sides of the second channel region 201, respectively. The metal oxide semiconductor material may be selected as an IGZO or an ITZO. In a preferred solution, a thickness of the first contact layer 221 and a thickness of the second contact layer 222 are preferably disposed to be 20-200 nm.

Further, in the present embodiment, the active layer 20 also includes a storage capacitor region 20c that is disposed at the same layer with the first active region 20a and the second active region 20b, and the storage capacitor region 20c includes a stack of a poly-silicon layer 214 and a boron-doped poly-silicon layer 223.

The gate insulating layer 30 is disposed covering the active layer 20.

The first metal layer 40 includes a first gate electrode 41, a second gate electrode 42 and a scan line 43, the first gate electrode 41 is relatively located right above the first channel region 211, the second gate electrode 42 is relatively located right above the second channel region 201, and one of scan lines 43 is relatively located right above the storage capacitor region 20c.

The interlayer dielectric layer 50 is disposed covering the first metal layer 40 to cover the first gate electrode 41, the second gate electrode 42 and the scan line 43.

The second metal layer 60 includes a first source electrode 61, a first drain electrode 62, a second source electrode 63, a second drain electrode 64, and a data line 65, the first source electrode 61 is connected to the first contact layer 221 through a first via hole 51 disposed in the interlayer dielectric layer 50 and the gate insulating layer 30, the first drain electrode 62 is connected to the second contact layer 222 through a second via hole 52 disposed in the interlayer dielectric layer 50 and the gate insulating layer 30, the second source electrode 63 is connected to the second source region 202 through a third via hole 53 disposed in the interlayer dielectric layer 50 and the gate insulating layer 30, the second drain electrode 64 is connected to the second drain region 203 through a fourth via hole 54 disposed in the interlayer dielectric layer 50 and the gate insulating layer 30, and one of data lines 65 is relatively located right above the storage capacitor region 20c.

The planarizing layer 70 is disposed covering the second metal layer 60 to cover the first source electrode 61, the first drain electrode 62, the second source electrode 63, the second drain electrode 64 and the data line 65.

The transparent conductive layer 80 includes a pixel electrode 81 which is connected to the second source electrode 63 through a fifth via hole 71 disposed in the planarizing layer 70. In some other embodiments, the pixel electrode 81 may also be connected to the second drain electrode 64 through the third via hole 71.

The thin film transistor array substrate as provided in the above embodiment is applied in an OLED display device, wherein the thin film transistor formed of the second active region 20b, the second gate electrode 42, the second source electrode 63 and the second drain electrode 64 is used as a driving transistor that drives a light emitting diode, the metal oxide semiconductor material is adopted as the active layer to utilize its advantage of comparatively good uniformity, such that the driving of respective sub-pixels in the OLED display device has good uniformity and stability. The thin film transistor formed of the first active region 20a, the first gate electrode 41, the first source electrode 61 and the first drain electrode 62 is used as a switching transistor that transmits data voltage to a gate node of the driving transistor, poly-silicon is adopted as the active layer to utilize its advantage of high mobility, such that the OLED display device has higher driving capacity, which is conducive to the improvement of luminance, resolution, and the like, and improve the display quality of the OLED display device.

In addition, in the first active region 20a, the first gate electrode 41, the first source electrode 61 and the first drain electrode 62 forming the switching transistor, the first source electrode 61 and the first drain electrode 62 are disposed with a first contact layer 221 and a second contact layer 222 of which the material is boron-doped poly-silicon, so as to reduce contact resistance between the first source electrode 61 and the first source region 212, and between the first drain electrode 62 and the first drain region 213, improve the electric performance of the thin film transistor, and further enhance the driving capacity of the sub-pixel.

Figure 2A:
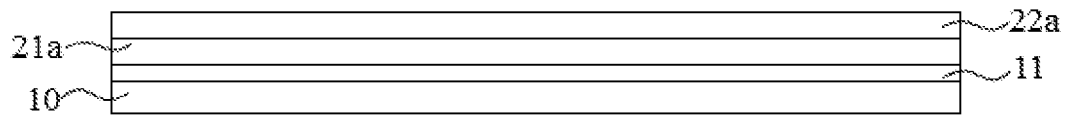
FIGS. 2A-2M are exemplary diagrams of device structures obtained in respective steps in a preparing method for a thin film transistor array substrate of an embodiment of the present disclosure.

The present embodiment also provides a preparing method for the thin film transistor array substrate as mentioned above, by referring to FIGS. 2A-2M, the method including the following steps:

S1: forming a patterned active layer 20 on a base substrate 10, wherein the active layer 20 includes a first active region 20a and a second active region 20b. The step may specifically include:

S11: as illustrated in FIG. 2A, depositing an amorphous silicon (a-Si) thin film layer 21a and a boron-doped amorphous silicon (a-Si) thin film layer 22a sequentially on the base substrate 10. Preferably, before depositing the amorphous silicon thin film layer 21a and the boron-doped amorphous silicon thin film layer 22a, a buffer layer 11 may be first prepared on the base substrate 10, and the buffer layer 11 may be a silicon oxide ($SiO_x$) layer, a silicon nitride ($SiN_x$) layer, or a composite structural layer of laminating the $SiO_x$ layer and the $SiN_x$ layer. In depositing the boron-doped amorphous silicon thin film layer 22a, a main raw material is still the material forming the amorphous silicon thin film, and a gas of $B_2H_6$ or $BH_3$ is also introduced at the same time, thereby obtaining the boron-doped amorphous silicon thin film layer 22a. In a preferred solution, a thickness of the boron-doped amorphous silicon thin film layer 22a may be selected to be 20-200 nm.

Figure 2B:
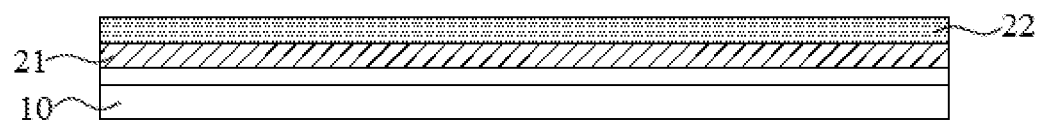

S12: as illustrated in FIG. 2B, performing crystallizing processing using the Solid Phase Crystallization method. In particular, the base substrate 10 deposited with the amorphous silicon film layer 21a and the boron-doped amorphous silicon film layer 22a is put into an annealing furnace, the crystallizing processing is performed on the amorphous silicon film layer 21a and the boron-doped amorphous silicon film layer 22a using a rapid thermal annealing process, the amorphous silicon film layer 21a is converted into a poly-silicon (poly-Si) thin film layer 21, and the boron-doped amorphous silicon film layer 22a is converted into a boron-doped poly-silicon (poly-Si) thin film layer 22. The rapid thermal annealing process is performed at a temperature of 500-1000° C. with a time of 5-60 minutes.

Figure 2C:
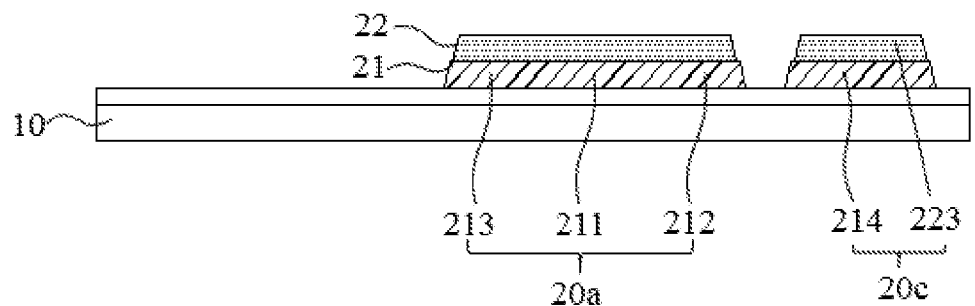

S13: as illustrated in FIG. 2C, etching the poly-silicon thin film layer 21 and the boron-doped poly-silicon thin film layer 22 by applying a first photoetching process to form a patterned first active region 20a, wherein the first active region 20a includes a first channel region 211, and a first source region 212 and a first drain region 213 that are located at both sides of the first channel region 211, respectively. In the step, when the first active region 20a is defined, the poly-silicon thin film layer 21 and the boron-doped poly-silicon thin film layer 22 at corresponding positions need to be remained at the same time.

In the present embodiment, the active layer 20 also includes a storage capacitor region 20c that is disposed at a same layer with the first active region 20a, and as illustrated in FIG. 2C, the storage capacitor region 20c includes a stack of a poly-silicon layer 214 and a boron-doped poly-silicon layer 223. In particular, when a patterning processing (a photoetching process) is performed on the poly-silicon thin film layer 21 and the boron-doped poly-silicon thin film layer 22, the poly-silicon thin film layer 21 and the boron-doped poly-silicon thin film layer 22 are remained at the same time at a position corresponding to the storage capacitor region 20c, the poly-silicon layer 214 is formed by etching the poly-silicon thin film layer 21, and the boron-doped poly-silicon layer 223 is formed by etching the boron-doped poly-silicon thin film layer 22.

Figure 2D:
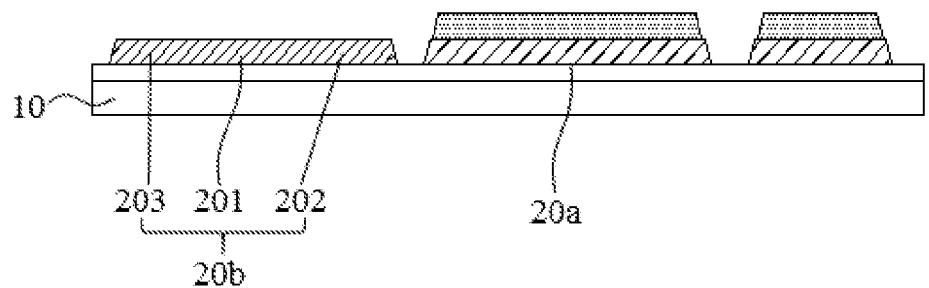

S14: as illustrated in FIG. 2D, forming a metal oxide semiconductor thin film layer on the base substrate 10 located outside the first active region 20a, and etching the metal oxide semiconductor thin film layer by using a second photoetching process to form a patterned second active region 20b, wherein the second active region 20b includes a second channel region 201, and a second source region 202 and a second drain region 203 that are located at both sides of the second channel region 201, respectively. A material of the metal oxide semiconductor thin film layer may include IGZO or ITZO.

Figure 2E:
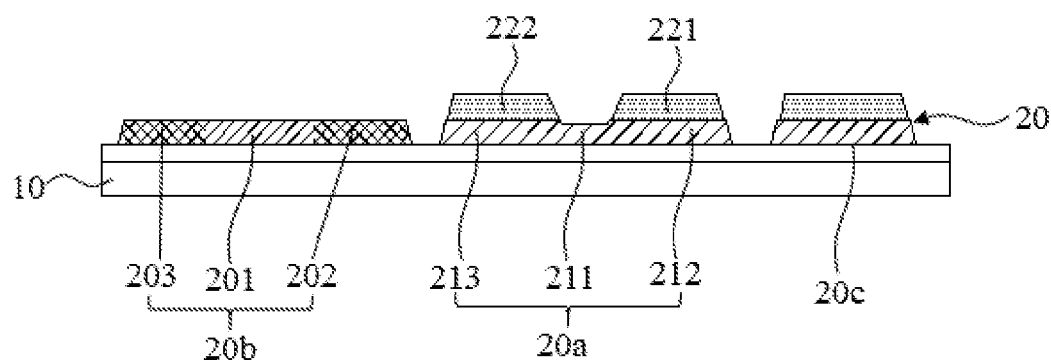

S15: as illustrated in FIG. 2E, further performing a patterning processing on the first active region 20a by using a third photoetching process. In particular, a boron-doped poly-silicon thin film layer located over the first channel region 211 is removed by etching to expose the poly-silicon thin film layer; the boron-doped poly-silicon thin film layer over the first source region 212 is remained to form a first contact layer 221, and the boron-doped poly-silicon thin film layer over the first drain region 213 is reserved to form a second contact layer 222. In the present embodiment, upon the third photoetching process, the boron-doped poly-silicon thin film layer over the first channel region 211 is removed by applying a plasma etching, and the plasma is also used to be injected into the second source region 202 and the second drain region 203 of the second active region 20b to convert the semiconductor materials of the second source region 202 and the second drain region 203 at both sides of the second channel region 201 into conductor materials. Thus, by referring to FIG. 2E, after the above process steps, a patterned active layer 20 is prepared on the base substrate 10, and the active layer 20 in the present embodiment includes the first active region 20a, the second active region 20b and the storage capacitor region 20c that are located in the same structural layer.

In the above process steps, upon the third photoetching process, a patterning process for the contact layer of the first active region 20a and an injection process of the second active region 20b are combined into one step to reduce the photoetching processes in the process of preparing the array substrate, which improves the production efficiency and reduces the production cost. Of course, in some other embodiments, an ion injection process for the second active region 20b may also be separated to form an independent process step.

Figure 2F:
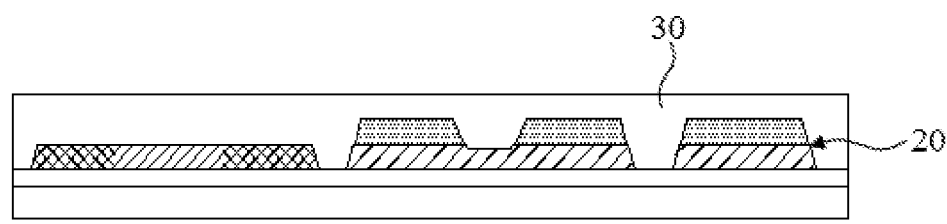

S2. as illustrated in FIG. 2F, forming a gate insulating layer 30 on the active layer 20. In particular, the gate insulating layer 30 may be a silicon oxide ($SiO_x$) layer, a silicon nitride ($SiN_x$) layer, or a composite structural layer of laminating the $SiO_x$ layer and the $SiN_x$ layer.

Figure 2G:
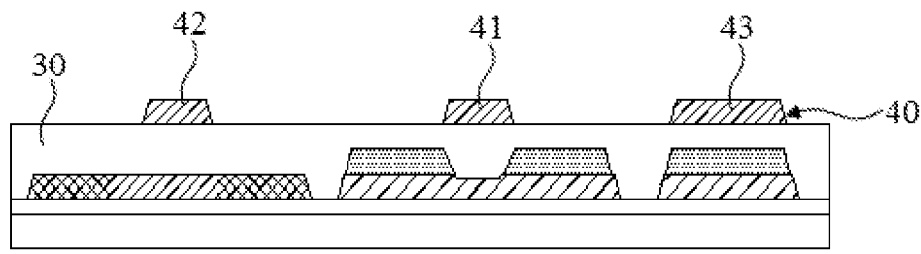

S3. as illustrated in FIG. 2G, forming a patterned first metal layer 40 on the gate insulating layer 30 by using a fourth photoetching process, wherein the first metal layer 40 includes a first gate electrode 41, a second gate electrode 42 and a scan line 43, the first gate electrode 41 is relatively located right above the first channel region 211, the second gate electrode 42 is relatively located right above the second channel region 201, and one of the scan lines 43 is relatively located right above the storage capacitor region 20c. A material of the first metal layer 40 is selected from but not limited to one or more of Cr, Mo, Al, and Cu, and the first metal layer 40 may be a layer or a multiple-layer stack.

Figure 2H:
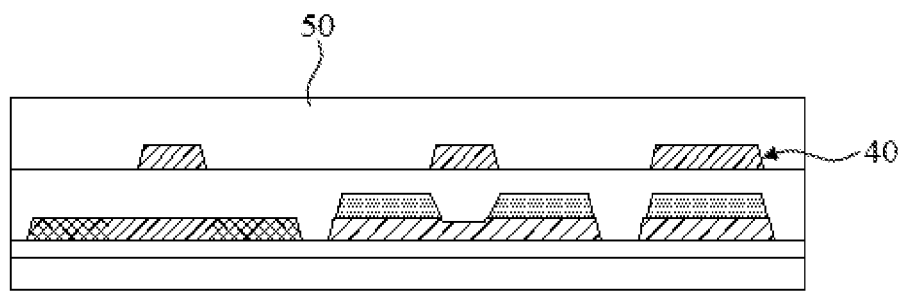

S4. as illustrated in FIG. 2H, forming an interlayer dielectric layer 50 on the first metal layer 40, wherein the interlayer dielectric layer 50 covers the first gate electrode 41, the second gate electrode 42 and the scan line 43. In particular, the interlayer dielectric layer 50 may be a silicon oxide ($SiO_x$) layer, a silicon nitride ($SiN_x$) layer, or a composite structural layer of laminating the $SiO_x$ layer and the $SiN_x$ layer.

Figure 2I:
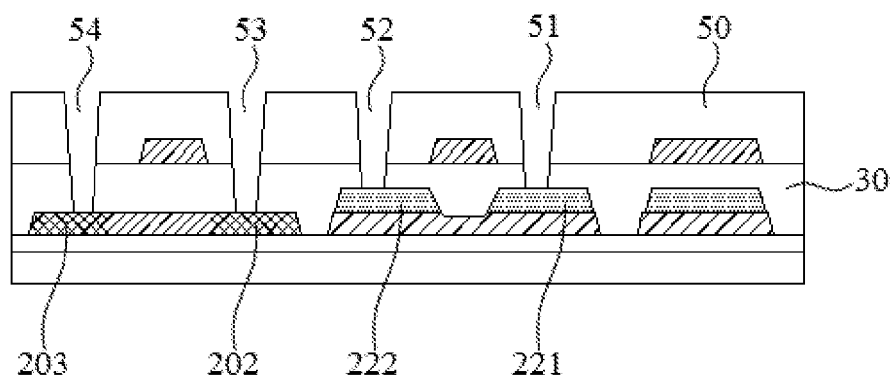

S5. as illustrated in FIG. 2I, etching in the interlayer dielectric layer 50 and the gate insulating layer 30 to form a first via hole 51 that exposes the first contact layer 221, a second via hole 52 that exposes the second contact layer 222, a third via hole 53 that exposes the second source region 202, and a fourth via hole 54 that exposes the second drain region 203 by using a fifth photoetching process.

Figure 2J:
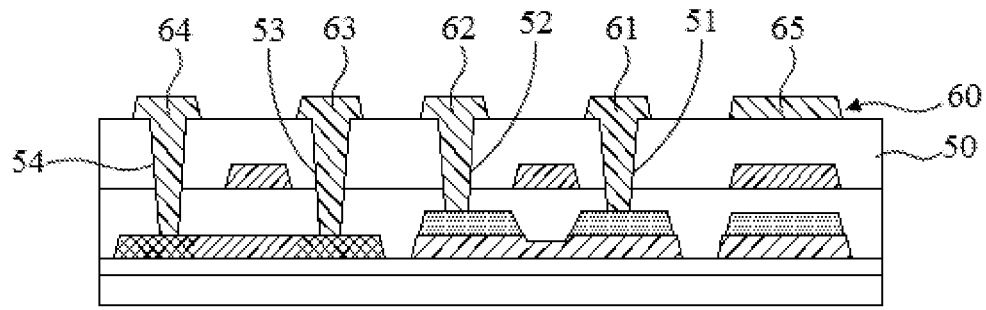

S6. as illustrated in FIGS. 2I and 2J, forming a patterned second metal layer 60 on the interlayer dielectric layer 50 by using a sixth photoetching process, wherein the second metal layer 60 includes a first source electrode 61, a first drain electrode 62, a second source electrode 63, a second drain electrode 64, and a data line 65, the first source electrode 61 is connected to the first contact layer 221 through the first via hole 51, the first drain electrode 62 is connected to the second contact layer 222 through the second via hole 52, the second source electrode 63 is connected to the second source region 202 through the third via hole 53, and the second drain electrode 64 is connected to the second drain region 203 through the fourth via hole 54, wherein a material of the second metal layer 60 is selected from but not limited to one or more of Cr, Mo, Al, and Cu, and the second metal layer 60 may be a layer or a multiple-layer stack. One of scan lines 65 is relatively located right above the storage capacitor region 20c.

Figure 2K:
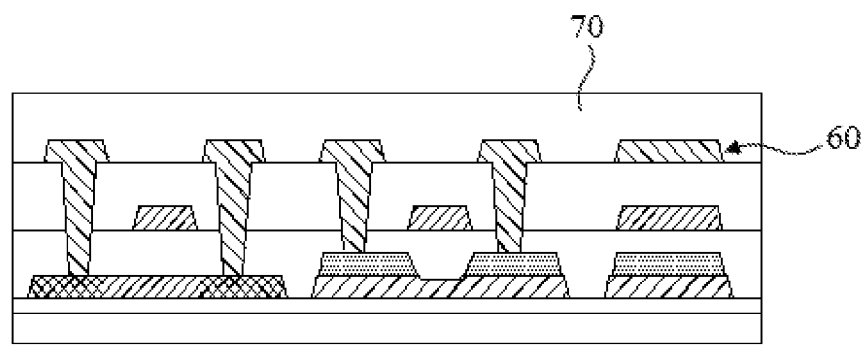

S7. as illustrated in FIG. 2K, forming a planarizing layer 70 on the second metal layer 60, wherein the planarizing layer 70 covers the first source electrode 61, the first drain electrode 62, the second source electrode 63, the second drain electrode 64 and the data line 65. In particular, the planarizing layer 70 may be a silicon oxide ($SiO_x$) layer, or a silicon nitride ($SiN_x$) layer, or a composite structural layer laminating the $SiO_x$ layer and the $SiN_x$ layer.

Figure 2L:
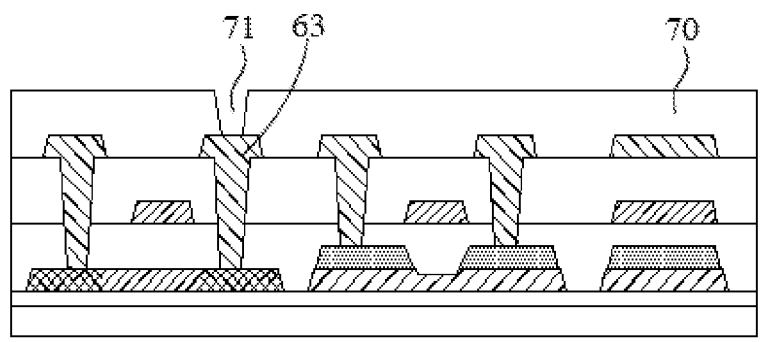

S8. as illustrated in FIG. 2L, etching in the planarizing layer 70 to form a fifth via hole 71 that exposes the second source electrode 63 by using a seventh photoetching process.

Figure 2M:
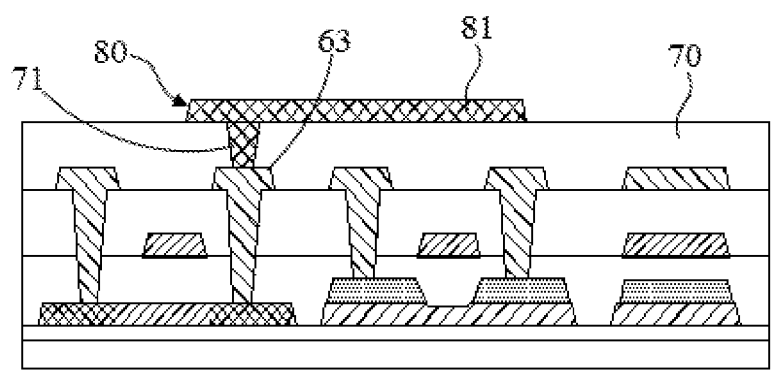

S9. as illustrated in FIG. 2M, forming a patterned transparent conductive layer 80 on the planarizing layer 70 by using an eighth photoetching process, wherein the transparent conductive layer 80 includes a pixel electrode 81 which is connected to the second source electrode 63 through the fifth via hole 71.

It needs to be explained that in step S8, the third via hole 71 may also be disposed at a position corresponding to the second drain electrode 64, and at the moment in step S9, the pixel electrode 81 is connected to the second drain electrode 64 through the third via hole 71.

In the above processing, the photoetching process (a patterning process) is adopted in a plurality of steps, wherein each photoetching process includes processes such as masking, exposing, developing, etching and peeling, and the etching process includes dry etching and wet etching. The photoetching process has been a comparatively mature process technology, which will not be explained in details here.

The preparing method for the thin film transistor array substrate provided in the above embodiments prepares active layers of two different materials on the base substrate to obtain thin film transistors that implement different functions, that is, a driving transistor and a switching transistor, in particular. In the whole process steps, other than the step of preparing the active layer in which two different thin film transistors need to be processed respectively, in the preparing of respective structural layers on the active layer, such as the gate insulating layer, the first metal layer, the interlayer dielectric layer, the second metal layer, the planarizing layer, and the like, the same process step is adopted for two different thin film transistors, which thereby reduces difficulty in production process, improves production efficiency, and reduces cost.

In addition, regarding the portion that adopts poly-silicon as the active layer, the Solid Phase Crystallization method is adopted to prepare a poly-silicon thin film, wherein a boron-doped amorphous silicon thin film layer is first prepared on an amorphous silicon thin film layer, when the Solid Phase Crystallization processing is performed, the crystallizing process starts from the boron-doped amorphous silicon thin film layer, a crystallizing temperature of the boron-doped amorphous silicon thin film layer is comparatively low, it can be converted into a boron-doped poly-silicon thin film layer at a comparatively low temperature faster to further induce the amorphous silicon thin film layer to be converted into a poly-silicon thin film, thereby lowering the crystallizing temperature of the amorphous silicon thin film layer and reducing the crystallizing time, which not only can prevent the base substrate from being deformed due to a high temperature, but also improves the production efficiency. In the embodiments of the present disclosure, the boron-doped amorphous silicon thin film layer is prepared through a depositing process, a gas of $B_2H_6$ or $BH_3$ is introduced while depositing the amorphous silicon thin film material, thereby obtaining the boron-doped amorphous silicon thin film layer, which has lower production cost compared with the manner of ion implantation.

Figure 3:
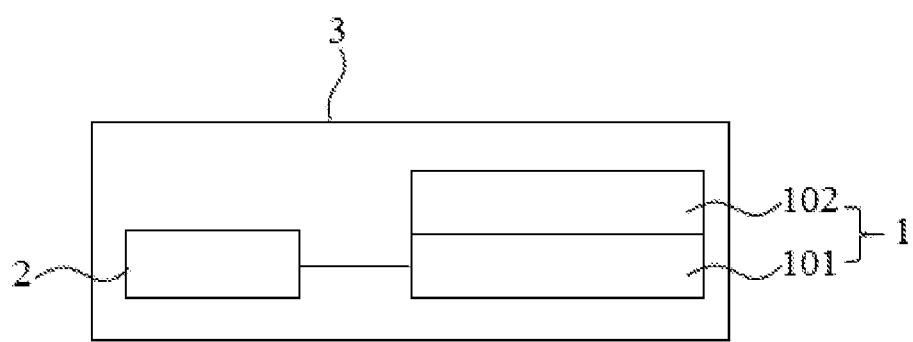
FIG. 3 is a structure diagram of an OLED display device provided in an embodiment of the present disclosure.

The present embodiment also provides an OLED display device in which a thin film transistor array substrate provided in the embodiments of the present disclosure is adopted. In particular, by referring to FIG. 3, the OLED display device includes a housing 3, and a driving unit 2 and a display unit 1 packaged in the housing 3, and the driving unit 2 provides a driving signal to the display unit 1 so as to enable the display unit 1 to display a picture. In particular, the display unit 1 includes an array substrate 101 and an organic light emitting structural layer 102 disposed on the array substrate 101, and the array substrate 101 adopts the thin film transistor array substrate provided in the preceding embodiments of the present disclosure.

It should be explained that the relationship terms, such as first and second, etc., in the present description are only used for distinguishing one entity or operation from another entity or operation without requiring or implying any actual relation or sequence existing between these entities or operations. Moreover, the terms "comprises," "comprising," "includes," and/or "including," means covering non-exclusive inclusion, so that the process, method, object or device including a series of factors not only include those factors but also include other factors that are not explicitly listed or further include inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without departing from the principle of the present application, also those improvements and polish should be considered as the protection scope of the present application.

What is claimed is:

1. A preparing method for a thin film transistor array substrate, comprising preparing a patterned active layer comprising a first active region and a second active region on a base substrate, the preparing of the patterned active layer comprising:

sequentially forming an amorphous silicon thin film layer and a boron-doped amorphous silicon thin film layer on the base substrate;

performing crystallizing processing on the amorphous silicon thin film layer and the boron-doped amorphous silicon thin film layer using a thermal annealing process, and correspondingly forming a poly-silicon thin film layer and a boron-doped poly-silicon thin film layer;

etching the poly-silicon thin film layer and the boron-doped poly-silicon thin film layer by using a first photoetching process to form a patterned first active region, wherein the first active region comprises a first channel region, and a first source region and a first drain region that are located at both sides of the first channel region, respectively;

forming a metal oxide semiconductor thin film layer on the base substrate located outside the first active region;

etching the metal oxide semiconductor thin film layer by using a second photoetching process to form a patterned second active region, wherein the second active region comprises a second channel region and a second source region and a second drain region that are located at both sides of the second channel region, respectively;

removing a portion of the boron-doped poly-silicon thin film layer located over the first channel region by using a third photoetching process, so that the boron-doped poly-silicon thin film layer over the first source region remains to form a first contact layer, and the boron-doped poly-silicon thin film layer over the first drain region remains to form a second contact layer; and converting the semiconductor materials of the second source region and the second drain region into conductor materials by applying an ion injection process, wherein in the third photoetching process, the boron-doped poly-silicon thin film layer over the first channel region is removed by applying a plasma etching, while the plasma is also used to inject ions into the second source region and the second drain region to convert the semiconductor materials of the second source region and the second drain region into the conductor materials.

2. The preparing method for the thin film transistor array substrate of claim 1, specifically comprising steps of:

S1: forming the patterned active layer on the base substrate;

S2: forming a gate insulating layer on the active layer;

S3: forming a patterned first metal layer on the gate insulating layer by using a fourth photoetching process, wherein the first patterned metal layer comprises a first gate electrode, a second gate electrode and a scan line, the first gate electrode is relatively located right above the first channel region, and the second gate electrode is relatively located right above the second channel region;

S4: forming an interlayer dielectric layer on the first gate electrode, the second gate electrode and the scan line;

S5: etching in the interlayer dielectric layer and the gate insulating layer to form a first via hole that exposes the first contact layer, a second via hole that exposes the second contact layer, a third via hole that exposes the second source region, and a fourth via hole that exposes the second drain region by using a fifth photoetching process;

S6: forming a patterned second metal layer on the interlayer dielectric layer by using a sixth photoetching process, wherein the second metal layer comprises a first source electrode, a first drain electrode, a second source electrode, a second drain electrode, and a data line, the first source electrode is connected to the first contact layer through the first via hole, the first drain electrode is connected to the second contact layer through the second via hole, the second source electrode is connected to the second source region through the third via hole, and the second drain electrode is connected to the second drain region through the fourth via hole;

S7: forming a planarizing layer on the first source electrode, the first drain electrode, the second source electrode, the second drain electrode and the data line;

S8: etching in the planarizing layer to form a fifth via hole that exposes the second source electrode or the second drain electrode by applying a seventh photoetching process; and S9: forming a patterned transparent conductive layer on the planarizing layer by using an eighth photoetching process, wherein the transparent conductive layer comprises a pixel electrode which is connected to the second source electrode or the second drain electrode through the fifth via hole.

3. The preparing method for the thin film transistor array substrate of claim 1, wherein the boron-doped amorphous silicon thin film layer has a thickness of 20-200 nm, the thermal annealing process is performed at a temperature of 500-1000° C. with a time of 5-60 minutes.

4. The preparing method for the thin film transistor array substrate of claim 1, wherein the active layer further comprises a storage capacitor region, when the first photoetching process is performed, a patterned storage capacitor region is formed by etching the poly-silicon thin film layer and the boron-doped poly-silicon thin film layer, and the storage capacitor region comprises a stack of a poly-silicon layer and a boron-doped poly-silicon layer.

5. The preparing method for the thin film transistor array substrate of claim 1, wherein the boron-doped amorphous silicon thin film layer is prepared through a depositing process, the depositing process comprising introducing a gas of $B_2H_6$ or $BH_3$ while depositing the amorphous silicon thin film material, thereby obtaining the boron-doped amorphous silicon thin film layer.

* * * * *